United States Patent [19]
West

[11] Patent Number: 5,403,527
[45] Date of Patent: Apr. 4, 1995

[54] METHOD OF MAKING PATTERNED ELECTRICALLY CONDUCTIVE STRUCTURES

[76] Inventor: Frederick A. West, 12722 Gorda Cir., Largo, Fla. 34643

[21] Appl. No.: 549,876

[22] Filed: Jul. 6, 1990

[51] Int. Cl.⁶ .......................... C04B 35/00; B32B 31/00
[52] U.S. Cl. ...................................... 264/104; 264/139
[58] Field of Search ............... 264/104, 138, 139, 219, 264/220, 225, 241, 259, 299, 313, 317

[56] References Cited

U.S. PATENT DOCUMENTS

| | | | |
|---|---|---|---|
| 4,067,945 | 1/1978 | Durocher | 264/104 |
| 4,402,135 | 9/1983 | Schweingruber | 29/832 |

*Primary Examiner*—Christopher A. Fiorilla
*Attorney, Agent, or Firm*—Charles A. McClure

[57] ABSTRACT

Making patterned electrically conductive structures, such as circuit elements, in single or multiple laminar form. The basic laminar structure is made by forming and filling an intaglio pattern in a non-conductive sheet with solidifiable electrically conductive material in pliable form, bonding the respective conductive and non-conductive materials in place and together, and removing the sheet portion underlying the conductive pattern to leave both the conductive and the non-conductive materials bonded laterally as a single lamina. Face-to-face juxtaposition of like or unlike laminae so made provides built-up or laminated products.

13 Claims, 3 Drawing Sheets

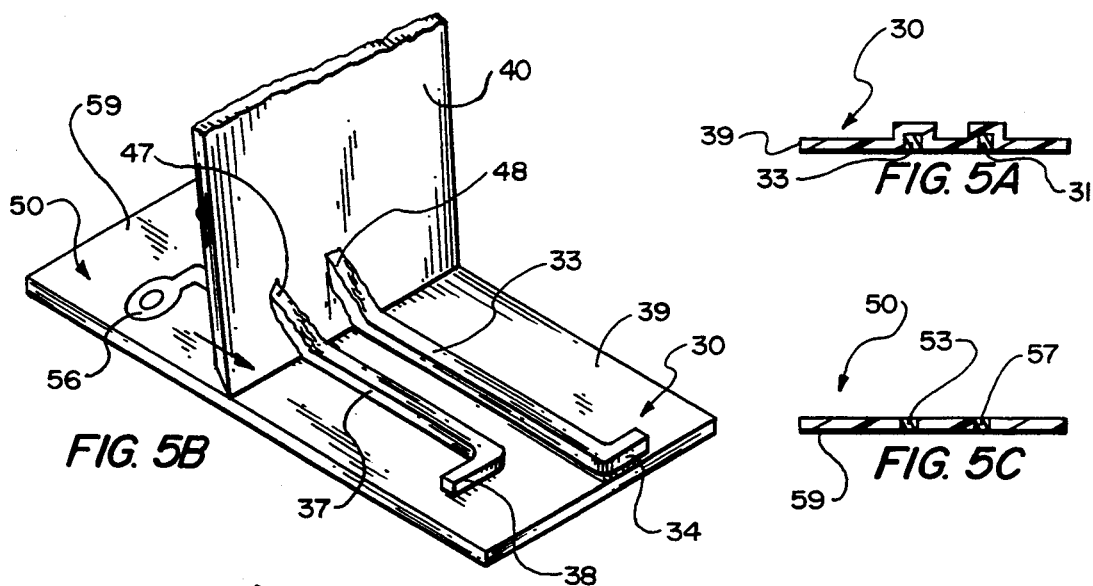
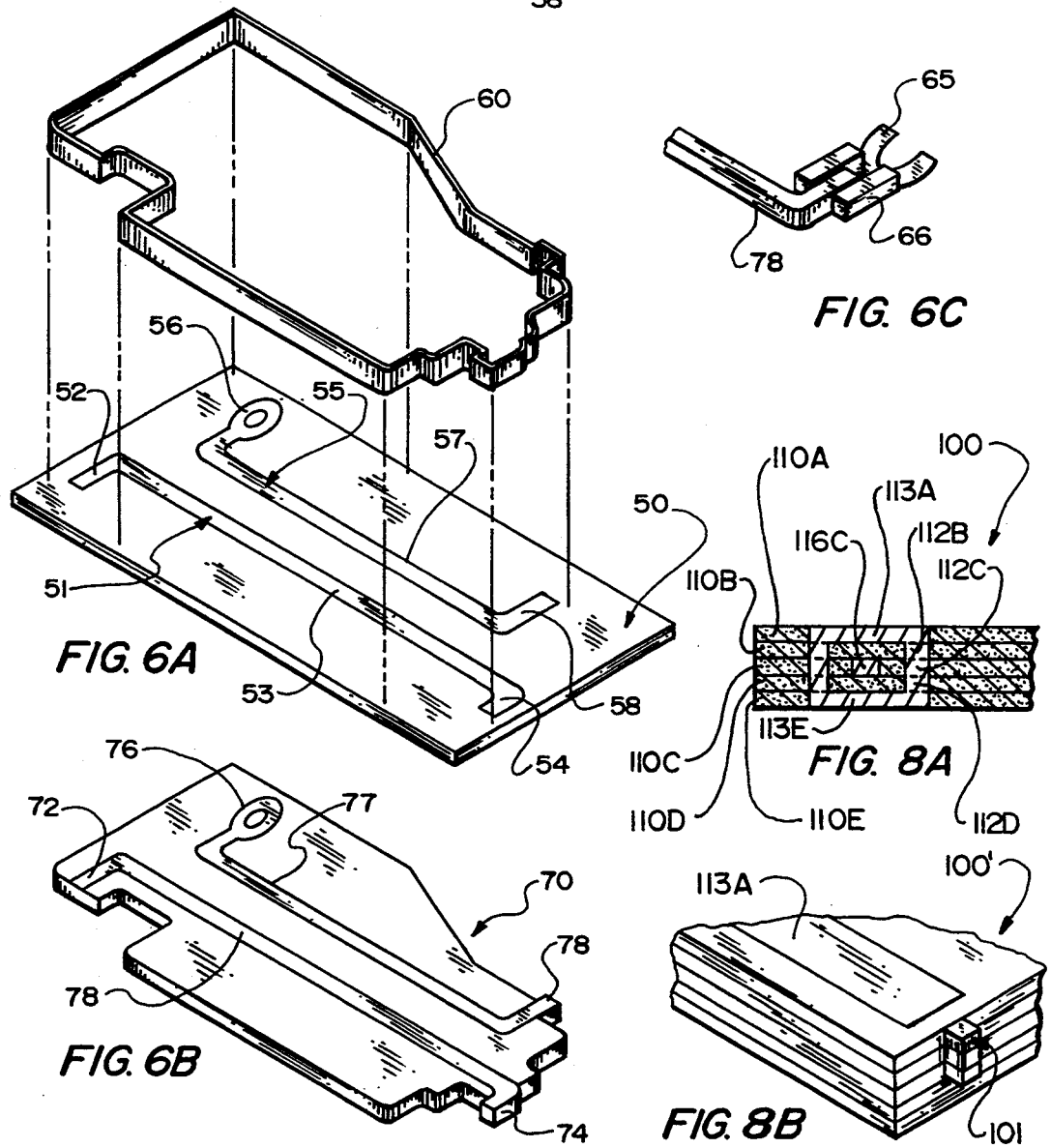

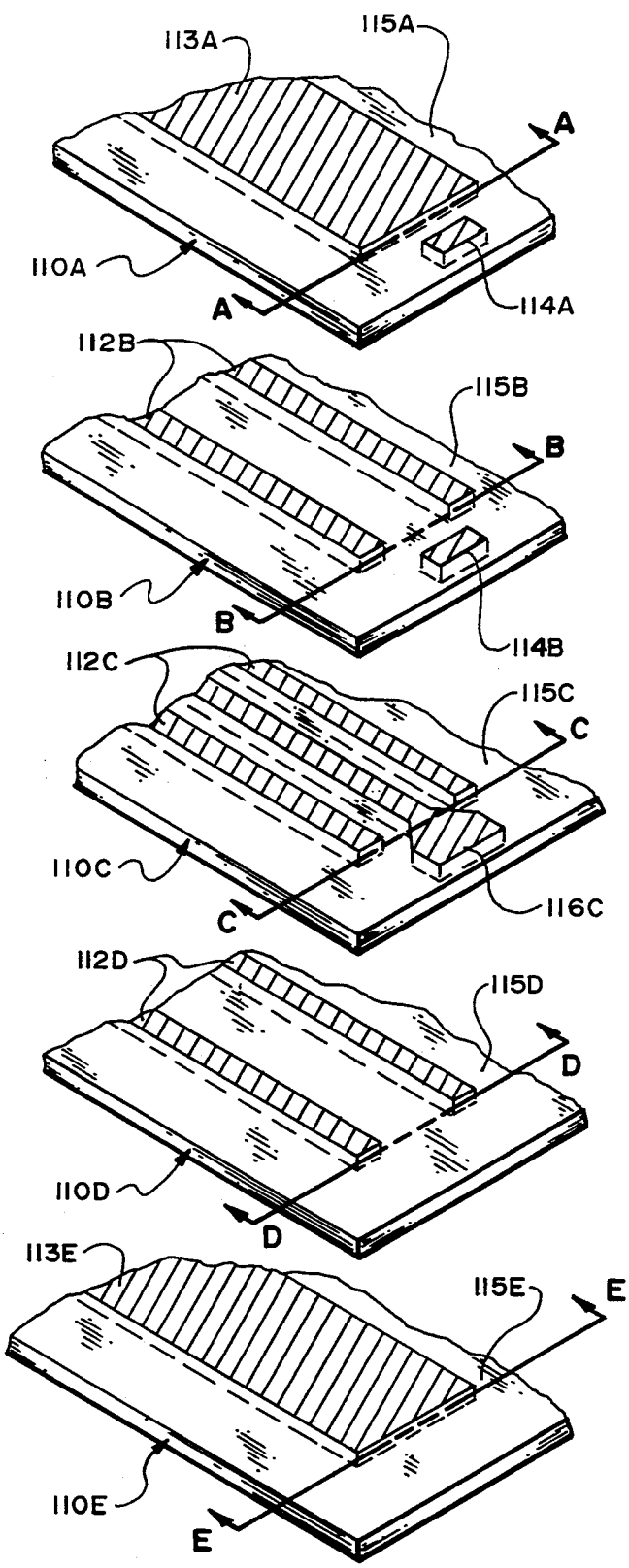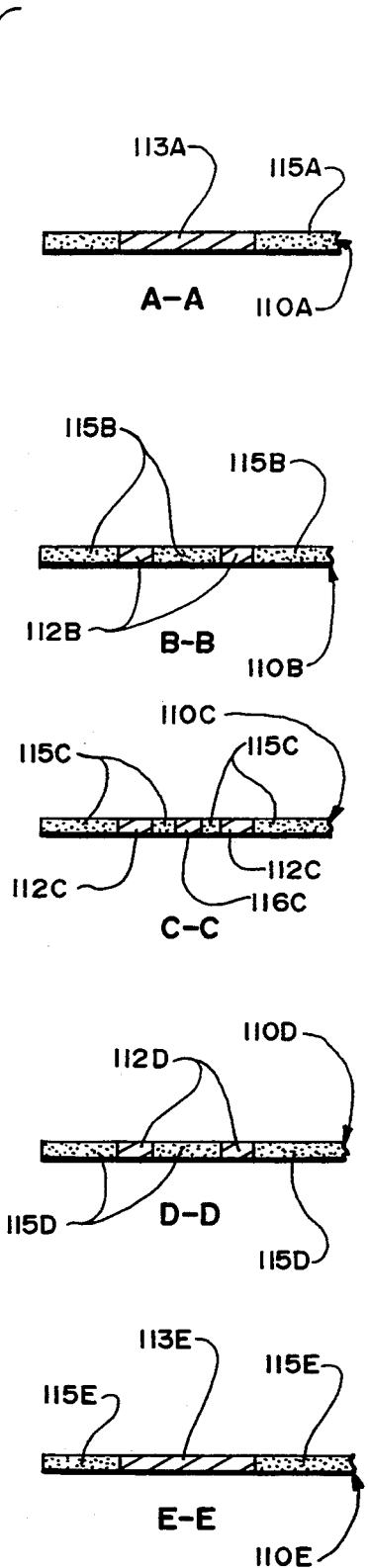
FIG. 7A
FIG. 7B 5,403,527

METHOD OF MAKING PATTERNED ELECTRICALLY CONDUCTIVE STRUCTURES

TECHNICAL FIELD

This invention relates to making patterned electrically conductive structures, such as circuit elements or circuitry in laminar form, or in laminated form.

BACKGROUND OF THE INVENTION

Numerous electrical products include at least one solid layer of non-conductive substrate carrying one or more patterned layers of electrical conductors. Examples include printed circuit boards in which conductive layers are—or are adapted to be—interconnected at given points, and often are further adapted to have lumped circuit elements mounted thereon or otherwise connected thereto.

Making such PC boards is complex and demands extreme degrees of precision, sanitation, and testing that are troublesome to attain and expensive to maintain. Interconnection integrity, especially between layers, is a frequent problem. Although PC board manufacture has given rise to many successful inventions, the state of the art leaves much to be desired in the way of economy and simplicity.

Other articles of quite different form, such as coaxial cables, and wiring harnesses, for example, pose additional problems, some being associated with conduction over much greater distances. Yet a new approach to those problems conceivably could solve them all, and that is just what my departure from the prior art is designed to do.

SUMMARY OF THE INVENTION

A primary object of this invention is to provide a structure configured with conductive solid material in given areas, and with non-conductive solid material elsewhere as a self-supporting lamina.

Another object of the invention is to provide structures built up from a plurality of such laminas juxtaposed face-to-face.

A further object is to manufacture the foregoing structures in continuous manner, as well as batchwise or intermittently.

In general, the objects of the present invention are attained in laminar structures having patterned solid conductive material within given areas and non-conductive material elsewhere configured side-by-side, whether as a single lamina, or a structure embodying a laminated plurality of such laminas in mutually contiguous form.

More particularly, such a basic laminar structure is made by forming and filling an intaglio pattern in a non-conductive sheet with solidifiable electrically conductive material in pliable form, bonding the respective conductive and non-conductive materials in place and together, and removing the sheet portion underlying the conductive pattern to leave both the conductive and the non-conductive materials bonded laterally as a single lamina.

SUMMARY OF THE DRAWINGS

FIG. 5A is a fragmentary transverse sectional elevation of the filled intaglio of FIGS. 4A and 4B re-inverted; with the intaglio base being trimmed off; to leave a lamina with conductive and non-conductive portions;

FIG. 5B is a perspective view of the structure shown in part in FIG. 5A;

FIG. 5C is an endwise sectional elevation of the resulting lamina, with patterned electrically conductive structures, after the trimming according to FIG. 5A.

FIG. 6A is a perspective view of the lamina of FIG. 5B about to be sheared vertically to remove lateral portions thereof;

FIG. 6B is a perspective view of the modified lamina resulting from the shearing according to FIG. 6A;

FIG. 6C is a perspective detail view, partly cut away, showing a terminal attached to a laterally protruding conductive portion of the same lamina;

FIG. 7A s a perspective view of a set of laminae with unlike patterned electrically conductive portions;

FIG. 7B is an endwise sectional elevation of the FIG. 7A set of laminae;

FIG. 8A is an endwise sectional elevation of the set of laminae of FIGS. 7A and 7B laminated together to form a thicker patterned electrically conductive structure; and FIG. 8B is a perspective view of the structure of FIG. 8A after being sheared laterally to expose a center conductor terminal lead.

FIG. 6A is a perspective view of the lamina of FIG. 5B about to be sheared vertically to remove lateral portions thereof;

FIG. 6B 4s a perspective view of the modified lamina resulting from the shearing according to FIG. 6A;

DESCRIPTION OF THE INVENTION

Figure 1A:
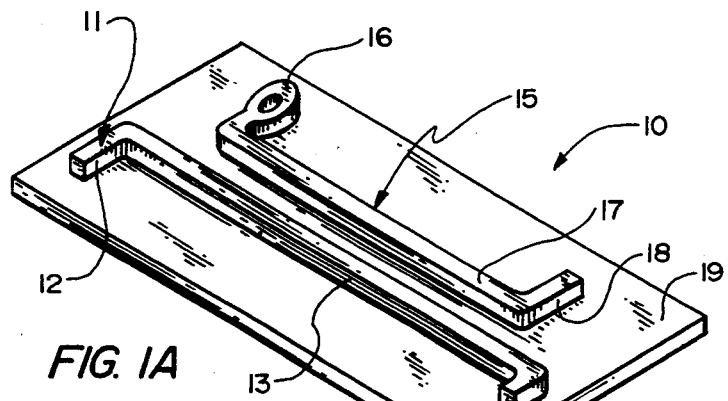
FIGS. 1A and 1B are, respectively, (a) a perspective view and (b) an endwise sectional elevation of a mold for use in making patterned electrically conductive articles according to this invention.
Figure 1B:
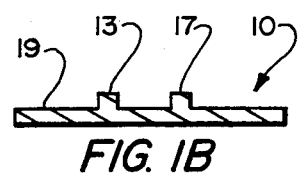

FIG. 1A shows in perspective, and FIG. 1B in medial transverse sectional elevation, relief mold 10 useful in making patterned articles according to this invention. The mold comprises rectangular base layer 19 and a relief layer made up of two unconnected parts 11 and 15 extending mainly lengthwise of the visible surface of the base, at a substantially unchanging elevation above the base. Relief part 11 has elongated body portion 13, terminating in ell 12 at the far end and in somewhat shorter ell at the near portion. Relief part 15 is shaped somewhat similarly but with eye 16 at one end, ell 18 at the opposite end of elongated body portion 17.

Figure 2A:
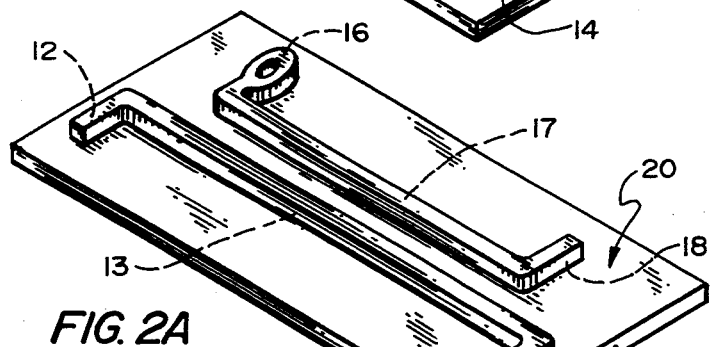
FIGS. 2A and 2B are a like pair of views of the preceding mold, now with a non-conducive lamina molded thereonto.
Figure 2B:
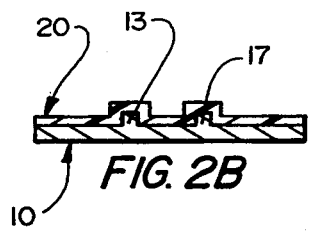

FIGS. 2A and 2B resemble respective FIGS. 1A and 1B except for being covered by continuous lamina 20, which faithfully follows the outline of the upper surface of the mold, shown underneath in dashed lines in FIG. 2A. FIG. 2B shows that lamina 20 is distorted out of its plane by a distance approximating its undistorted thickness.

Figure 3A:
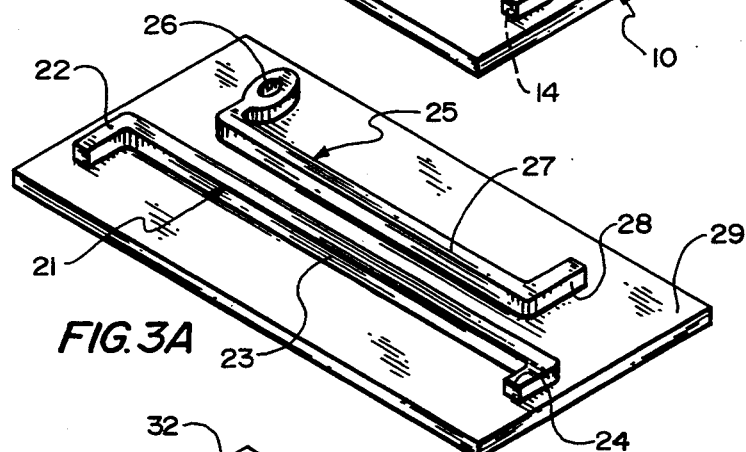
FIGS. 3A and 3B are a like pair of views of the non-conductive lamina of FIGS. 2A and 2B, removed from the mold.
Figure 3B:
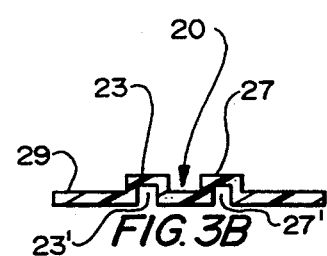

FIGS. 3A and 3B resemble the respective views of the preceding pairs of diagrams, except that only lamina 20 is present, closely resembling the mold on which it was formed, and with its corresponding parts similarly numbered ten greater (i.e., 20 series instead of 10 series). Indentations on the bottom corresponding to protrusions on the top are similarly numbered but with a prime (') added. Thus, in the medial section shown in FIG. 3B, elongated raised middle parts 23 and 27 appear from below as indented parts 23' and 27'. It will be apparent that, if the lamina itself were inverted, so that the previous bottom became the top, parts that previously appeared in bas relief would appear as in intaglio—and be numbered with like numbers primed to distinguish the indentations from the protrusions, which then would lie underneath on the bottom surface.

Figure 4A:
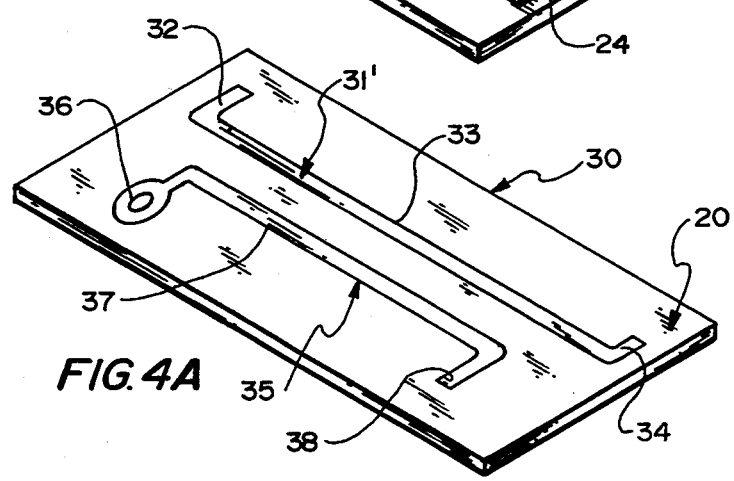
FIGS. 4A and 4B are a like pair of views of the non-conductive lamina inverted into intaglio configuration, filled with conductive material, and exposed to bonding conditions.
Figure 4B:
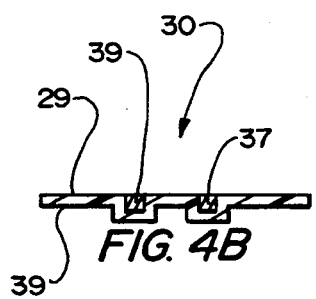

FIGS. 4A and 4B show lamina 20 so inverted, but—instead of being alone—it is shown here with its indented portions filled with conductive material flush with the its top surface and redesignated in such entirety as laminate 30. (The conductive filled parts are numbered as the similarly patterned ones were previously, except this time in the 30 series. Such similarity in numbering renders it unnecessary to describe similar parts in detail yet another time.) As noted further below, the conductive filling material is added in fluent form and is bonded in place and together with the adjacent parts of the component lamina.

FIG. 5A shows in sectional elevation a portion of laminate 30 of the last preceding pair of views re-inverted, with the conductive material in elongated parts 33 and 37 remaining laminated in place.

FIG. 5B shows the forming product at an intermediate stage in its conversion into a single-thickness multi-component lamina bonded laterally. Angled blade 40 has its sharp edge against former bottom (now top) surface of laminate 30 and is moving along it, as indicated by an arrow, thereby shaving the protruding parts, here 33 and 37, from the rest of the structure. Such removed portions, designated 43 and 47, are shown distorted and rising along the blade. Behind the blade the resulting shaved structure, now again a single lamina, is designated as 50, with eye 56 visible (all such parts being now similarly in the 50 series).

FIG. 5C shows resulting lamina 50 in sectional elevation, and with conductive parts 53 and 57 flanked laterally by non-conductive base portion 59.

FIG. 6A shows in perspective, lamina 50 of the preceding view about to be sheared vertically by "cookie cutter" die 60 overhead.

FIG. 6B shows the resulting reduced outline of resulting lamina 70 (similar parts numbered similarly in the 70 series). Ells 72, 74, and 78 are now exposed laterally to the exterior.

FIG. 6C is a detailed perspective showing terminal 65 secured to conductive ell 78 by means of metallic fastener 66 crimped around both the terminal and the ell. An insulating sleeve (not shown) may be shrink-wrapped about the conductive fastener if desired.

It will be apparent that single laminae, so produced, may be laminated together to provide multi-layer laminated products, either thicker versions of a single lamina made up of multiple identical laminae, or more complex products made up of unlike laminae. Production of the latter type of product (a waveguide) is exemplified in the following diagrams. It will be understood that the individual laminae are prepared in the manner just described for the lamina of preceding views. Because of the many differences in the patterned electrically conductive areas, a new three-digit numbering scheme for these concluding views replaces the previous two-digit scheme used for the preceding views, without parallelism between them.

FIGS. 7A and 7B show, sequential pairs of exploded perspective and edge sectional views, respectively, embodiment 100 of this invention, composed of laminae 110A, 110B, 110C, 110D, and 110E individually exemplified (variously patterned) by the described first embodiment and juxtaposed into mutual contiguity to give a markedly thicker three-dimensional product than the thin constituent laminae.

Top lamina 110A has large rectangular conductive portion 113A, small rectangular conductive portion 114A spaced from the narrow end of portion 113A and near an edge of non-conductive portion 115A laterally surrounding the conductive portions—on all sides, as distinguished from the upper and lower surfaces.

Second lamina 110B has pair of narrow strips 112B parallel to one another, underlying the long edges of portion 110A of lamina 110A, with their outer edges spaced apart the width of portion 110A. This second lamina also has small rectangular portion 114B underlying like portion 114A of lamina 110A, and has more extensive non-conductive portion 115B laterally surrounding the conductive parts.

Third lamina 110C, in the middle vertically, has a like pair of narrow conductive strips 112C aligned with strips 112B of lamina 110B, and has narrow strip 116C along and midway between that pair of strips and terminating in a headed rectangular end underlying the like portion of immediately overlying lamina 110B. It also has non-conductive portion 115C surrounding the conductive portions.

Fourth lamina 110D has only pair of narrow conductive strips 112D, underlying the other pairs of such strips, and surrounded laterally (on all sides) by non-conductive portion 115D.

Bottom lamina 110E in FIGS. 7A and 7B has large rectangular conductive portion 110E matching the corresponding portion of the top lamina, but no smaller rectangular portion to match portion 116A.

In actual embodiment 100, the foregoing individual laminae, notwithstanding their illustrated vertical separation, are mutually contiguous from top to bottom, as shown in the next view.

FIG. 8A shows in sectional elevation such resulting laminated laminar embodiment 100, wherein conductive portions 113A, 112B, 112C, 116C, 112D, and 113E form a waveguide with rectangular cross-section and with coaxial conductor 116C supported laterally therein by non-conductive portion 115C of former lamina—now layer—110C; is supported above by non-conductive portion 115B of layer 110B; and is supported below by non-conductive portion 115D of layer 110D. Top layer 110A provides top conductive wall portion 113A of layer 110A, and bottom layer 110E provides bottom conductive wall portion 113E of the coaxial waveguide structure. The sidewalls are composed of conductive portions 112B, 112C, and 112D. Of course, for waveguide purposes, the dielectric provided by the intervening parts of non-conductive material is appropriate. The layers in such laminated structure are bonded together, as by heat exposure in an autoclave.

FIG. 8B shows in perspective waveguide 100' otherwise just like waveguide 100 after having been sheared vertically so that center conductor lead 101 is quite exposed, and excess non-conductive edge portions are trimmed away.

Other circuit elements can be produced in like manner. Thus, a capacitor can be constructed from upper and lower conductive laminae and an intervening non-conductive lamina. Connections to circuit elements created in situ or captured or left outside are readily made via adjacent conductive parts of one or more adjacent layers or by leads inserted through resulting openings. In short, this invention is so versatile that an infinite variety of circuit boards can readily be so constructed. Moreover, such construction is very inexpensive.

This invention does not require rare or exotic compositions but is adapted to being practiced with readily available materials. Thus, the molded lamina may be composed of fibrous material, such as paper or non-woven fabric, or non-fibrous material, such as film, whether of organic thermoplastic or thermosetting polymers, or inorganic material, such as glass, ceramic, or siloxane. Mixed organic-inorganic materials may be used, such as an organic polymeric film reinforced with an inorganic fibrous material. An example of such a suitable mixed material is epoxy resin reinforced with glass fibers.

Forming the lamina may be accomplished by molding the initial sheet in pliant condition, such as an incompletely cured polymeric resin and then curing it, or a fully cured resin sheet or other stiff material may be configured on the mold by vacuum-forming.

A thermosetting polymer, such as an epoxy resin or a phenolformaldehyde or melamine-formaldehyde resin may be used as or in the sheet material, with or without reinforcing fibers of glass or other electrically non-conductor. Solvent or plasticizer for such polymer may be present in the filling material, with or without inert diluent, and be evaporated therefrom by exposure to ambient air, preferably with heating above ambient temperature.

The conductive filling materials are preferably supplied in paste form, including electrically conductive particulate material, such as metallic powder or flakes, or even non-metallic material such as graphite. Suitable metallics include aluminum, copper, gold, indium, lead, silver, tin, and the platinum group metals. Upon evaporation of solvent or similar carrier or diluent therefrom, the conductive particulates are retained in intimate mutual contact. If the paste includes a polymerizable resin, it can bond the conductive material in intimate self-contact by a resulting reticulated matrix or network of micromolecular polymeric strands. Bonding is fostered not only by passage of time but also customarily by heating and optionally by action of ultra-violet light or included catalyst.

Suitable conductive paste compositions, although considered specialty chemicals, are articles of commerce and readily available. Suppliers thereof include Minico/Asahi Chemical of America, located in Congers, N. Y., for example. Such compositions are suitable for screening through about 100 to 300 mesh, as are mixes of them.

Satisfactory curing temperatures depend upon solvents and/or resins present, but a range suited to many of the compositions is from about ten to thirty minutes at from about 100° to 200° C., usually in the mid-range of both time and temperature. Substitution of more intense infra-red radiation sources is often effective to reduce the time to less than half, even to a fifth or even a tenth.

When laminating a plurality of laminae together, similar times and temperatures are often effective. Autoclaving may be desirable.

Preferred embodiments and variants have been suggested for this invention. Other modifications may be made, as by adding, combining, deleting, or subdividing compositions, parts, or steps, while retaining all or some of the advantages and benefits of the present invention—which itself is defined in the following claims.

I claim:

1. Method of configuring a laminar structure with patterned electrical circuitry portions, comprising the steps of forming in intaglio in a sheet of electrically non-conductive material a desired pattern for at least one electrical conductor, filling the intaglio pattern in the non-conductive sheet with solidifiable electrically conductive material, and removing the intaglio base portion of the non-conductive sheet underlying the conductive pattern to leave the conductive material and remaining portions of non-conductive material as a lamina.

2. Method according to claim 1 wherein the non-conductive sheet comprises a polymeric resin initially cured sufficiently to maintain its shape but not so as to keep its intaglio portion from bonding laterally to the conductive filling material therein when further cured and such conductive material solidifies.

3. Method according to claim 1, including the step of heating the sheet with the filled intaglio portion above ambient temperature until the solidifiable electrically conductive material solidifies.

4. Method according to claim 1, wherein the solidifiable conductive material comprises a paste containing metallic particulates.

5. Method according to claim 4, comprising including in the solidifiable conductive material one or more of aluminum, copper, gold, graphite, indium, lead, silver, tin, or platinum group metals.

6. Method of making a self-supporting laminar structure made up of side-by-side patterned electrically conductive portions and non-conductive portions of substantially like laminar thickness, comprising the steps of providing a mold having in relief to a given height above the base thereof a desired pattern of electrically conductive material, forming onto the mold an electrically non-conductive sheet of substantially uniform laminar thickness, thereby producing in intaglio in the non-conductive sheet the likeness of the desired pattern, filling the intaglio pattern in the non-conductive sheet with adherent solidifiable electrically conductive material, solidifying the conductive material in place adherent to the non-conductive sheet, and shaving off the intaglio portion of the sheet underlying the conductive pattern to leave both the conductive and the remaining non-conductive materials side by side as a single lamina.

7. Method according to claim 6, including the added step of perpendicularly shearing non-conductive material away from part of the patterned conductive material to leave at least one conductive end portion exposed.

8. Method according to claim 7, including the step of affixing an electrical connector onto such exposed conductive end portion.

9. Method comprising laminating together a plurality of laminae formed according to the method of claim 6.

10. Method according to claim 9, wherein the laminated laminae are unlike in their respective electrically conductive portions, and the resultant product comprises a three-dimensional circuit element.

11. In production of patterned electrical structures having side-by-side electrically conductive and non-conductive portions, an improved method comprising forming a non-conductive sheet into intaglio form to receive one or more conductive portions therein.

12. The improved method of claim 11 plus the step of inserting conductive material in an intaglio part of the non-conductive sheet.

13. The improved method of claim 11 plus the step of shaving away non-conductive material from the intaglio of the non-conductive sheet underlying the location of inserted conductive material.

* * * * *